United States Patent
Jung et al.

(10) Patent No.: US 8,405,093 B2
(45) Date of Patent: Mar. 26, 2013

(54) LIGHT EMITTING DEVICE

(75) Inventors: MyungHoon Jung, Seoul (KR); HyoKun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/178,171

(22) Filed: Jul. 7, 2011

(65) Prior Publication Data

US 2012/0007100 A1    Jan. 12, 2012

(30) Foreign Application Priority Data

Jul. 8, 2010  (KR) ........................ 10-2010-0065976

(51) Int. Cl.
*H01L 29/20*    (2006.01)
(52) U.S. Cl. ........................................... 257/76
(58) Field of Classification Search ........ 257/76
See application file for complete search history.

(56) References Cited

U.S. PATENT DOCUMENTS

| | | | | |
|---|---|---|---|---|
| 6,153,894 A | * | 11/2000 | Udagawa | ........................ 257/96 |
| 2004/0129200 A1 | * | 7/2004 | Kouvetakis et al. | ............... 117/2 |
| 2008/0149949 A1 | * | 6/2008 | Nakamura et al. | ............... 257/89 |
| 2009/0311811 A1 | * | 12/2009 | Oh et al. | ......................... 438/28 |
| 2010/0109020 A1 | * | 5/2010 | Yoo | ................. 257/76 |
| 2010/0148150 A1 | * | 6/2010 | Miki | ............... 257/13 |
| 2011/0049470 A1 | * | 3/2011 | Yoo | ................. 257/13 |
| 2012/0112203 A1 | * | 5/2012 | Enya et al. | ..................... 257/76 |

* cited by examiner

*Primary Examiner* — Thao P. Le
(74) *Attorney, Agent, or Firm* — Birch, Stewart, Kolasch & Birch, LLP

(57) ABSTRACT

Disclosed is a light emitting device including a substrate, a reflective layer provided on the substrate, and a light emitting structure, which includes a first conductive semiconductor layer, a second conductive semiconductor layer and an active layer placed between the first and second conductive semiconductor layers, wherein the first conductive semiconductor layer is an n-type semiconductor layer including GaN and doped with an n-type dopant, wherein the first conductive semiconductor layer includes a first n-type semiconductor layer and a second n-type semiconductor layer between the first n-type semiconductor layer and the active layer, wherein one surface of the first n-type semiconductor layer contacts the second n-type semiconductor layer, and wherein the surface of the first n-type semiconductor layer contacting the second n-type semiconductor layer is formed in an N-phase. The disclosed light emitting device may have improved luminous efficacy while showing reduction in crystal defects.

19 Claims, 14 Drawing Sheets

LIGHT EMITTING DEVICE

CROSS-REFERENCE TO RELATED APPLICATION

This application claims the priority benefit of Korean Patent Application No. 10-2010-0065976, filed on Jul. 8, 2010 in the Korean Intellectual Property Office, the disclosure of which is incorporated herein by reference.

BACKGROUND

1. Field

Embodiments relate to a light emitting device.

2. Description of the Related Art

As a representative example of a light emitting device, a light emitting diode (LED) is a device which converts electricity into infrared light, visible light, etc., using characteristics of compound semiconductors. LEDs are now being applied to devices such as home appliances, remote controls, electronic signboards, displays, a variety of automatic appliances and the like and the application range thereof continues to expand.

Generally, a miniaturized LED is fabricated as a surface mount device such that it can be directly mounted on a printed circuit board (PCB). Accordingly, an LED lamp used as a display device is also developed in a surface mount device form. Such a surface mount device may substitute for a conventional lamp and is used for lighting displays, character displays, image displays and the like, rendering various colors.

As the application range of LEDs widens, brightness required for lights in daily use and lights for structural signals increases. Accordingly, it is important to increase luminosity of LEDs. Also, a semiconductor layer such as GaN grown on a heterogeneous substrate such as a sapphire board has a large quantity of crystal defects due to lattice mismatch between the substrate and the semiconductor layer, and such defects may adversely influence reliability of a light emitting device and absorb light, thus decreasing brightness of the light emitting device.

SUMMARY OF THE INVENTION

Therefore, embodiments provide a light emitting device and a method for fabrication of the same.

According to one embodiment, there is provided a light emitting device, including; a light emitting structure that has a first conductive semiconductor layer, a second conductive semiconductor layer and an active layer positioned between the first and second conductive semiconductor layers, wherein the first conductive semiconductor layer includes GaN, is an n-type semiconductor layer doped with n-type dopant, and has a first n-type semiconductor layer and a second n-type semiconductor layer between the first n-type semiconductor layer and the active layer, and wherein one surface of the first n-type semiconductor layer comes in contact with the second n-type semiconductor layer and is formed in an N-phase.

The first n-type semiconductor layer has a thickness of 2 to 3 μm.

The n-type dopant includes at least one of Si, Ge and Sn.

The first n-type semiconductor layer has a first refractive index while the second n-type semiconductor layer has a second refractive index, and the first refractive index is equal to or smaller than the second refractive index.

In addition, a second electrode is provided on the second conductive semiconductor layer, a substrate is provided under the first conductive semiconductor layer, and a reflective layer is positioned between the substrate and the first conductive semiconductor layer. Further, the active layer and the second conductive semiconductor layer are partially removed to expose a part of the top side of the first conductive semiconductor layer, and a first electrode is placed on the exposed top side of the first conductive semiconductor layer.

The reflective layer includes any one selected from Ag, Ni, Al, Rh, Pd, Ir, Ru, Mg, Zn, Pt, Au and Hf.

An adhesive layer is provided between the substrate and the reflective layer.

The adhesive layer includes a polymer resin.

Moreover, a light transmitting electrode layer is provided on the second conductive semiconductor layer.

By removing at least one region of the light transmitting electrode layer, the second electrode contacts the second conductive semiconductor layer through the exposed region.

Additionally, a substrate is provided under the second conductive semiconductor layer, a first electrode is placed between the substrate and the second conductive semiconductor layer, and a second electrode is provided on the first conductive semiconductor layer.

Furthermore, an uneven part having a predetermined roughness is formed on the first semiconductor layer.

According to one embodiment, there is provided a method for fabrication of a light emitting device, including; a first process of providing a first n-type semiconductor layer on a first substrate, a second process of providing a second substrate on a first surface of the first n-type semiconductor layer, a third process of removing the first substrate formed on the first n-type semiconductor layer to expose a second surface of the first n-type semiconductor layer, a fourth process of etching the second surface of the first n-type semiconductor layer, a fifth process of providing a second n-type semiconductor layer on the second surface of the first n-type semiconductor layer, a sixth process of forming an active layer on the second n-type semiconductor layer, and a seventh process of providing a second conductive semiconductor layer on the active layer.

With regard to the method for fabrication of a light emitting device according to one embodiment, the first conductive semiconductor layer includes GaN and the second surface of the first n-type semiconductor layer is in contact with the first n-type semiconductor layer and, in addition, the second surface of the first n-type semiconductor layer is formed in an N-phase.

With regard to the method for fabrication of a light emitting device according to one embodiment, the second substrate includes a reflective layer and the reflective layer is between the first n-type semiconductor layer and the second substrate.

With regard to the method for fabrication of a light emitting device according to one embodiment, an adhesive layer is provided between the reflective layer and the second substrate.

The method for fabrication of a light emitting device according to one embodiment further includes an eighth process of partially removing each of the active layer and second conductive semiconductor layer to expose a part of the first conductive semiconductor layer, and a ninth process of forming first and second electrodes in the exposed region of the first conductive semiconductor layer and the second conductive semiconductor layer, respectively.

The method for fabrication of a light emitting device according to one embodiment further includes a tenth process of providing a first electrode layer and a third substrate on the second conductive semiconductor layer, and an eleventh process of removing the second substrate.

The method for fabrication of a light emitting device according to one embodiment further includes a twelfth process of providing a light extraction structure and a second electrode layer on the first conductive semiconductor layer.

BRIEF DESCRIPTION OF THE DRAWINGS

The embodiments will be more clearly understood from the following detailed description taken in conjunction with the accompanying drawings, in which.

DETAILED DESCRIPTION OF THE PREFERRED EMBODIMENTS

Figure 1A:
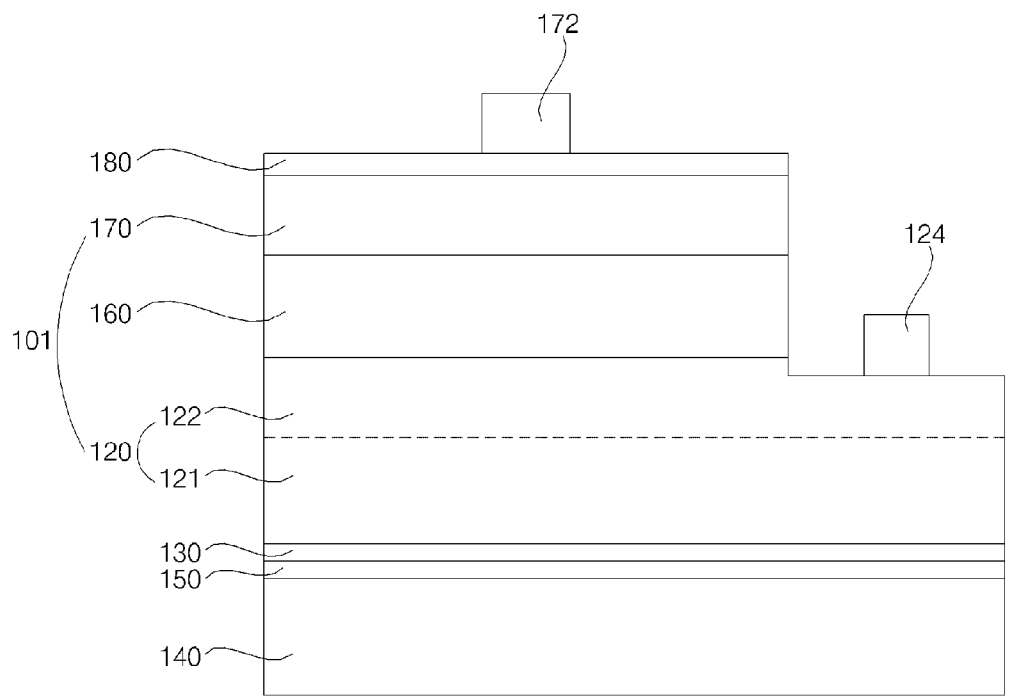
FIGS. 1A and 1B are cross-sectional views illustrating a configuration of a light emitting device according to one embodiment.

Prior to description of the embodiments, it will be understood that when an element such as a layer (film), region, pattern, or structure is referred to as being formed "on" or "under" another element, such as a substrate, layer (film), region, pad, or pattern, it can be directly "on" or "under" the other element or be indirectly formed with intervening elements therebetween. Further, "on" or "under" will be described based on illustration in the drawings.

In the drawings, thicknesses and/or sizes of respective layers may be enlarged, omitted or schematically illustrated for convenience of explanation or clarity. In addition, sizes of respective elements may not entirely reflect the real size thereof.

Hereinafter, the present embodiments will be described in more detail with reference to the annexed drawings.

Figure 1B:
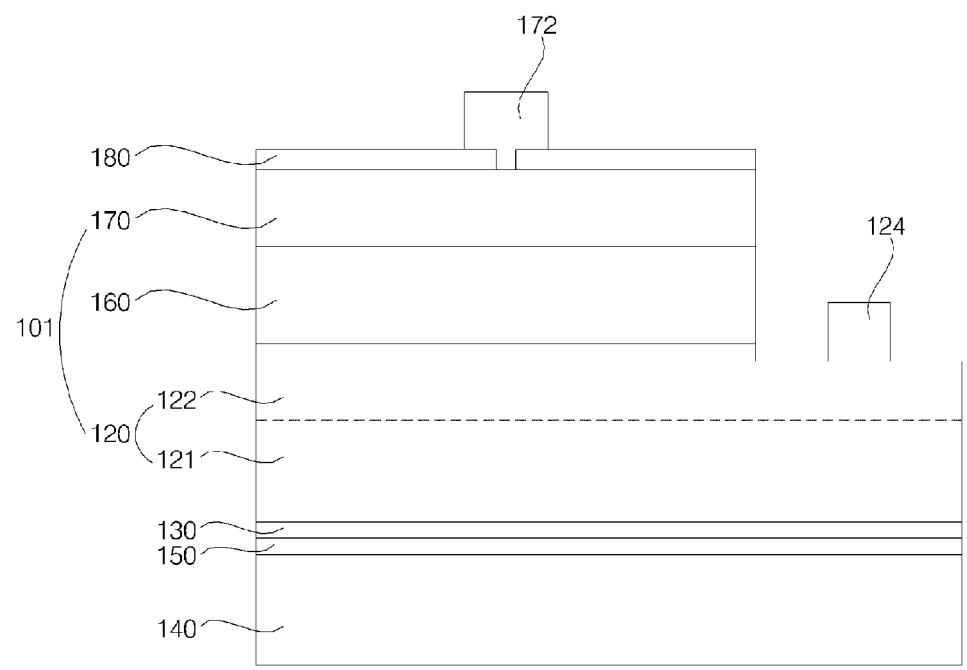

FIGS. 1A and 1B are cross-sectional views illustrating a configuration of a light emitting device according to one embodiment.

Referring to FIG. 1A, a light emitting device 100 may include a substrate 140, a reflective layer 130 placed on the substrate, and a light emitting structure 101 provided on the reflective layer 130, which has a first conductive semiconductor layer 120, a second conductive semiconductor layer 170 and an active layer 160 positioned between the first and second conductive semiconductor layers 120 and 170, wherein the first conductive semiconductor layer 120 includes GaN, is an n-type semiconductor layer doped with n-type dopant, and has a first n-type semiconductor layer 121 and a second n-type semiconductor layer 122 formed on the first n-type semiconductor layer 121, and wherein one surface of the first n-type semiconductor layer faces (or contacts) the second n-type semiconductor layer 122 and may be formed in an N-phase.

The substrate 140 may be formed of a sapphire ($Al_2O_3$) or silicon (Si) wafer. Other than these, some materials having excellent thermal conductivity and/or conductive materials may be used to fabricate the substrate 140. In particular, metals or conductive ceramics may be used. The substrate 140 may be formed in a single, double or multi-layered structure.

The substrate 140 may facilitate dissipation of heat generated from the light emitting device 100, which in turn enhances thermal stability of the light emitting device 100.

The reflective layer 130 may reflect light, thus improving light extraction efficiency of the light emitting device 100, when light emitted from the active layer 160 of the light emitting structure 101 is partially directed to the substrate 140.

In this regard, the reflective layer 130 may contain any one selected from Ag, Ni, Al, Rh, Pd, Ir, Ru, Mg, Zn, Pt, Au and Hf. Alternatively, the reflective layer 130 may be formed using metal oxides to secure a stable state at a high temperature of 1000° C. or higher during manufacture of the light emitting device 100.

Meanwhile, the substrate 140 and reflective layer 130 may be attached by an adhesive layer 150. The adhesive layer 150 may comprise a polymer resin not to be molten while retaining adhesion at a temperature of 1000° C. or higher, for example, a polymer adhesive useable at high temperature, without being particularly limited thereto.

A light emitting structure 101 may be provided on the reflective layer 130. The light emitting structure 101 may at least include the first conductive semiconductor layer 120, active layer 160 and second conductive semiconductor layer 170.

The first conductive semiconductor layer 120 may be realized with an n-type semiconductor layer and supply electrons to the active layer 160. The first conductive semiconductor layer 120 may comprise any one selected from semiconductor materials represented by the formula of $In_xAl_yGa_{1-x-y}N$ ($0 \leq x \leq 1, 0 \leq y \leq 1, 0 \leq x+y \leq 1$), for example, a group consisting of GaN, AlN, AlGaN, InGaN, InN, InAlGaN, AlInN, etc., and may be doped with n-type dopants such as Si, Ge, Sn, etc.

In addition, an undoped semiconductor layer (not shown) may be provided under the first conductive semiconductor layer 120, without being particularly limited thereto. In this case, the undoped semiconductor layer may be provided to improve crystallinity of the first conductive semiconductor layer 120 and may be substantially identical to the first conductive semiconductor layer 120, except that the undoped semiconductor layer has lower electrical conductivity than the first conductive semiconductor layer 120, since it is not doped with an n-type dopant.

Meanwhile, in the case where the first conductive semiconductor layer 120 is realized with an n-type semiconductor layer, the first conductive semiconductor layer 120 may include a first n-type semiconductor layer 121 and a second n-type semiconductor layer 122 formed on the first n-type semiconductor layer 121.

The first n-type semiconductor layer 122 may be formed to a thickness of 2 to 3 μm.

As described below, the second n-type semiconductor layer 122 may be grown again and formed on the first n-type semiconductor layer 121.

In this case, one surface of the first n-type semiconductor layer 121 may contact the second n-type semiconductor layer 122 and the contact surface of the first-n-type semiconductor layer 121 may be formed in an N-phase. Therefore, the second n-type semiconductor layer 122 grown on top of the first n-type semiconductor layer 121 may have decreased crystal defects and exhibit high crystal quality.

Meanwhile, the first and second n-type semiconductor layers 121 and 122 may have the same constitutional composition and/or be formed using the same materials, without being particularly limited thereto.

Alternatively, the first and second n-type semiconductor layers may have different constitutional compositions. For instance, the first n-type semiconductor layer has a first refractive index while the second n-type semiconductor layer has a second refractive index, wherein the first refractive index may be equal to or less than the second refractive index.

Since a refractive index of the second n-type semiconductor layer is greater than that of the first n-type semiconductor layer, light emitted from the active layer 160 may be totally reflected at an interface between the second n-type semiconductor layer and the first n-type semiconductor layer, which in turn improves luminous efficacy of the light emitting device 100.

The first conductive semiconductor layer 120 may be provided with the active layer 160. The active layer 160 may be formed in a single or multi-quantum well structure, a quantum-wire structure or a quantum dot structure or the like, using Group III-V compound semiconductor materials.

In the case where the active layer 160 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

The second conductive semiconductor layer 170 may be provided on the active layer 160.

The second conductive semiconductor layer 170 may be realized with a p-type semiconductor layer and introduce holes into the active layer 160. The second conductive semiconductor layer 170 may comprise any one selected from semiconductor materials represented by the formula of $In_xAl_yGa_{1-x-y}N$ ($0 \leq x \leq 1$, $0 \leq y \leq 1$, $0 \leq x+y \leq 1$), for example, a group consisting of GaN, AlN, AlGaN, InGaN, InN, InAlGaN, AlInN, etc., and may be doped with p-type dopants such as Mg, Zn, Ca, Sr, Ba, etc.

The first conductive semiconductor layer 120, active layer 160 and second conductive semiconductor layer 170 may be fabricated by conventional methods, for example; metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), and so forth, however, the method is not particularly limited thereto.

In contrast to the foregoing, the first conductive semiconductor layer 120 may be realized as a p-type semiconductor layer while the second conductive semiconductor layer 170 is an n-type semiconductor layer. In addition, a third conductive semiconductor layer (not shown) comprising an n-type or p-type semiconductor layer may be provided on the second conductive semiconductor layer 170. Accordingly, the light emitting device 100 may include at least one of N-P, P-N, N-P-N and P-N-P junction structures, without being particularly limited thereto.

Again referring to FIG. 1A, a light transmitting electrode layer 180 may be arranged on the second conductive semiconductor layer 170 and a second electrode 172 may be provided on a part of the outer side of the light transmitting electrode layer 180.

The light transmitting electrode layer 180 may include at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, Ni/$IrO_x$/Au and Ni/$IrO_x$/Au/ITO, and may transmit light emitted from the active layer 160 to the outside. In addition, the light transmitting electrode layer 180 may be formed in at least one region of the outer side of the second conductive semiconductor layer 170, thus preventing current crowding.

As shown in FIG. 1B, the region of the light transmitting electrode layer 180 is partially removed and the second conductive semiconductor layer 170 contacts a second electrode pad through the removed region, without being particularly limited thereto.

Meanwhile, the first conductive semiconductor layer 120 may be partially exposed through etching and a first electrode 124 may be positioned on top of the exposed region of the first conductive semiconductor layer 120. That is, the top and bottom sides of the first conductive semiconductor layer 120 may be directed to the active layer 160 and the substrate 140, respectively. Here, the top side may include the exposed region and the first electrode 124 may be arranged on the exposed region of the top side.

In this regard, each of the first and second electrodes 124 and 174 may comprise conductive materials, for example, metals selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or alloys thereof, and may be formed to have a single layer or multi-layer structure, without being particularly limited thereto.

Figure 2:
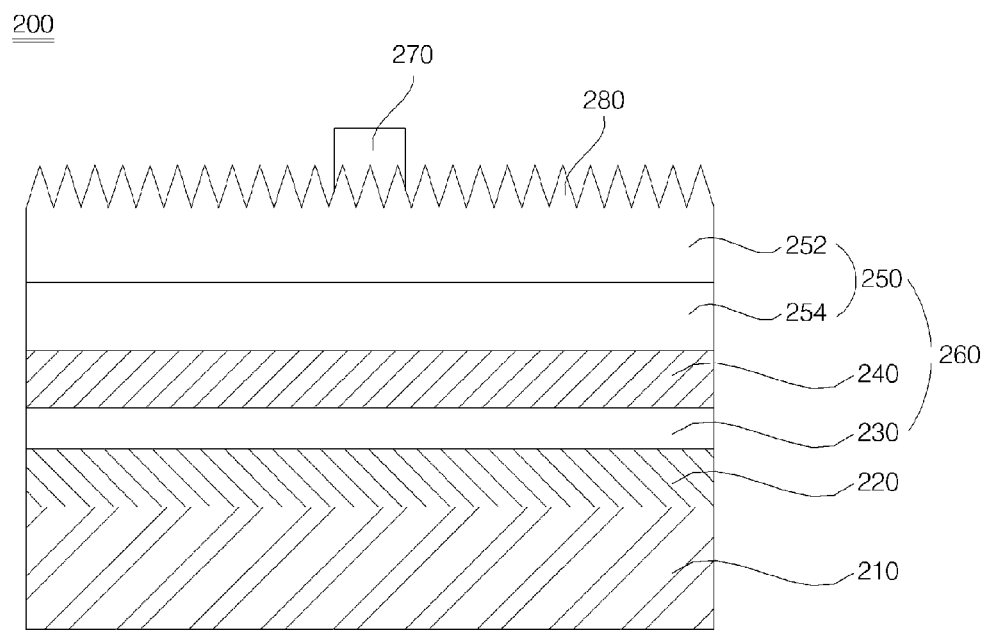
FIG. 2 is a cross-sectional view illustrating a configuration of a light emitting device according to one embodiment.

FIG. 2 illustrates a light emitting device according to one embodiment.

Referring to FIG. 2, a light emitting device 200 may include a support member (that is, substrate) 210, a first electrode layer 220 provided on the substrate 210, a light emitting structure 260 which comprises; a first conductive semiconductor layer 230, an active layer 240 and a second conductive semiconductor layer 250, as well as a second electrode layer 270.

The substrate 210 may be formed using some materials having excellent thermal conductivity and/or conductive materials. In particular, metals or conductive ceramics may be used. The substrate 210 may be formed in a single, double or multi-layered structure.

More particularly, the substrate 210 may be formed using any one selected from metals, for example, Au, Ni, W, Mo, Cu, Al, Ta, Ag, Pt or Cr, or alloys of two or more thereof, and may be fabricated by laminating two or more different materials. Moreover, the substrate 210 may be realized with a carrier wafer such as Si, Ge, GaAs, ZnO, SiC, SiGe, GaN, $Ga_2O_3$, or the like.

The substrate 210 may facilitate dissipation of heat generated from the light emitting device 200, which in turn enhances thermal stability of the light emitting device 200.

Meanwhile, the first electrode layer 220 may be provided on the substrate 210 and comprise at least one selected from an ohmic layer (not shown), a reflective layer (not shown) or a bonding layer (not shown). For instance, the first electrode layer 220 may have an ohmic layer/reflective layer/bonding layer structure, an ohmic layer/reflective layer laminate structure or a reflective layer (containing ohmic portion)/bonding layer structure, without being particularly limited thereto. For example, the first electrode layer 220 may be formed in a structure such that a reflective layer and an ohmic layer are sequentially laminated on an insulating layer.

The reflective layer (not shown) may be placed between the ohmic layer (not shown) and the insulating layer (not shown), and may be formed using any material having excellent reflectivity, for example, metals selected from Ag, Ni, Al, Rh, Pd, Ir, Ru, Mg, Zn, Pt, Au or Hf, or selective combinations thereof, or may be fabricated in a multi-layered structure, using the metals described above together with conductive materials having transmissive properties such as IZO, IZTO, IAZO, IGZO, IGTO, AZO, ATO, etc. Also, the reflective layer (not shown) may be formed of a laminate such as IZO/Ni, AZO/Ag, IZO/Ag/Ni, AZO/Ag/Ni, etc. When the reflective layer (not shown) is formed using a material capable of ohmic contact with the light emitting structure 260 (e.g., the first conductive semiconductor layer 230), an ohmic layer (not shown) may not be required, thus being omitted, without being particularly limited thereto.

The ohmic layer (not shown) exhibits ohmic contact at the bottom side of the light emitting structure 260 and may be formed in a layer or multiple patterns. The ohmic layer (not shown) may selectively comprise a light transmitting electrode layer and metal, for example, may be realized in a single layer or multi-layered structure, using at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO. The ohmic layer (not shown) may enable smooth injection of a carrier into the first conductive semiconductor layer 230, however, is not necessarily formed.

The first electrode layer 220 may have a bonding layer (not shown) and, in this case, the bonding layer (not shown) may contain a barrier metal or bonding metal, for example, at least one selected from Ti, Au, Sn, Ni, Cr, Ga, In, Bi, Cu, Ag or Ta, without being particularly limited thereto.

The light emitting structure 260 may comprise the first conductive semiconductor layer 230, active layer 240 and second conductive semiconductor layer 250, wherein the active layer 240 is interposed between the first and second conductive semiconductor layers 230 and 250.

The first conductive semiconductor layer 230 may be formed on the first electrode layer 220. The first conductive semiconductor layer 230 may be realized with a p-type semiconductor layer doped with a p-type dopant. The p-type semiconductor layer may comprise any one selected from semiconductor materials having the formula of $In_xAl_yGa_{1-x-y}N$ ($0 \leq x \leq 1$, $0 \leq y \leq 1$, $0 \leq x+y \leq 1$) such as GaN, AlN, AlGaN, InGaN, InN, InAlGaN and AlInN and may be doped with a p-type dopant such as Mg, Zn, Ca, Sr or Ba.

The first conductive semiconductor layer 230 may be provided with the active layer 240. The active layer 240 may be formed in a single or multi-quantum well structure, a quantum-wire structure or a quantum dot structure or the like, using Group III-V compound semiconductor materials.

In the case where the active layer 240 has a quantum well structure, for example, it may have a single or multi-quantum well structure including a well layer having the formula of $In_xAl_yGa_{1-x-y}N$ ($0 \leq x \leq 1$, $0 \leq y \leq 1$, $0 \leq x+y \leq 1$) and a barrier layer having the formula of $In_aAl_bGa_{1-a-b}N$ ($0 \leq a \leq 1$, $0 \leq b \leq 1$, $0 \leq a+b \leq 1$). The well layer may be formed of a material having a smaller band gap than the barrier layer.

A conductive clad layer (not shown) may be arranged on and/or under the active layer 240. The conductive clad layer (not shown) may be formed of an AlGaN-based semiconductor and may have a greater band gap than the active layer 240.

Alternatively, an intermediate layer (not shown) may be provided between the active layer 240 and the first conductive semiconductor layer 230 and, in this case, the intermediate layer (not shown) may serve as an electron blocking layer to prevent a phenomenon wherein electrons injected from the second conductive semiconductor layer 250 to the active layer 240 do not recombine (with holes) in the active layer 240 but flow to the first conductive semiconductor layer 230, when high current is applied thereto. Since the intermediate layer (not shown) has a greater band gap than the active layer 240, a phenomenon in that electrons injected from the second conductive semiconductor layer 250 do not recombine in the active layer 240 but, instead, are injected into the first conductive semiconductor layer 230, may be successfully prevented. As a result, a probability of recombination between electrons and holes in the active layer 240 may be increased and leakage current may be prevented.

The afore-mentioned intermediate layer (not shown) may have a greater band gap than a barrier layer included in the active layer 240, and may be composed of a semiconductor layer containing Al, such as p-type AlGaN, without being particularly limited thereto.

The second conductive semiconductor layer 250 may be positioned on the active layer 240. The second conductive semiconductor layer 250 may be realized with an n-type semiconductor layer and the n-type semiconductor layer may be selected from semiconductor materials represented by the formula of $In_xAl_yGa_{1-x-y}N$ ($0 \leq x \leq 1$, $0 \leq y \leq 1$, $0 \leq x+y \leq 1$), for example, a group consisting of GaN, AlN, AlGaN, InGaN, InN, InAlGaN, AlInN, etc., and may be doped with n-type dopants such as Si, Ge, Sn, etc.

In the case where the second conductive semiconductor layer 250 is realized with an n-type semiconductor layer, the second conductive semiconductor layer 250 may include a first n-type semiconductor layer 252 and a second n-type semiconductor layer 254 formed between the first n-type semiconductor layer 252 and the active layer 240.

The first n-type semiconductor layer 252 may be formed to a thickness of 2 to 3 μm.

As described above, the second n-type semiconductor layer 254 may be formed and re-grown on the first n-type semiconductor layer 252.

In this regard, one surface of the first n-type semiconductor layer 252 may contact the second n-type semiconductor layer 254 and such contact surface of the first n-type semiconductor layer 252 may be formed in an N-phase. Therefore, the second n-type semiconductor layer 254 grown on top of the first n-type semiconductor layer 252 may have decreased crystal defects and exhibit high crystal quality.

Meanwhile, the first and second n-type semiconductor layers 252 and 254 may have the same constitutional composition and/or be formed using the same materials, without being particularly limited thereto.

The second conductive semiconductor layer may be provided with the second electrode layer 270, which is electrically connected to the second conductive semiconductor layer 250, and the second electrode layer 270 may include at least one pad and/or electrode having a predetermined pattern. The second electrode layer 270 may be arranged in a center, outer or edge region of the top side of the second conductive semiconductor layer 250, without being particularly limited thereto. The second electrode layer 270 may be arranged on other parts except for the top side of the second conductive semiconductor layer 250, without being particularly limited thereto.

The second electrode layer 270 may be formed in a single layer or multi-layered structure, using conductive materials, for example, metals selected from In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or alloys thereof.

Meanwhile, the light emitting structure 260 may further include a third conductive semiconductor layer (not shown) having polarity opposite to the second conductive semiconductor layer 250. Also, the first conductive semiconductor layer 230 may be an n-type semiconductor layer while the second conductive semiconductor layer 250 is a p-type semiconductor layer. Accordingly, the light emitting structure 260 may include at least one of N-P, P-N, N-P-N and P-N-P junction structures, without being particularly limited thereto.

The light emitting structure 260 may be provided with a light extraction structure 280 on a top side thereof.

The light extraction structure 280 may be positioned above the second conductive semiconductor layer 250 or, after forming a light transmitting electrode layer (not shown) on top of the light emitting structure 260, provided on the light transmitting electrode layer (not shown), without being particularly limited thereto.

The light extraction structure 280 may be formed on a part of the top side or throughout the top side of the second conductive semiconductor layer 250 or the light transmitting electrode layer (not shown). The light extraction structure 280 may be formed by etching at least one region of the top side of the second conductive semiconductor layer 250 or the light transmitting electrode layer (not shown), without being particularly limited thereto. Such etching may include a wet etching and/or dry etching process and, after etching, the top side of the second conductive semiconductor layer 250 or the light transmitting electrode layer (not shown) may have roughness, resulting in the light extraction structure 280. Such roughness may be irregularly formed to a random size, without being particularly limited thereto. The roughness is an uneven top side and may have at least one selected from a texture pattern, a dent pattern and an uneven pattern.

The roughness may be formed to have a lateral cross-section in a variety of shapes, such as a circular column, polyangular column, circular cone, polyangular pyramid, circular truncated cone or polyangular truncated pyramid, or the like. Preferably, the roughness has a lateral cross-section in a cone shape.

Meanwhile, the light extraction structure 280 may be fabricated by a conventional method such as a photo-electro chemical (PEC) process, without being particularly limited thereto. Since the light extraction structure 280 is formed on the top side of the second conductive semiconductor layer 250 or the light transmitting electrode layer (not shown), it is possible to prevent light emitted from the active layer 240 from being totally reflected from the top side of the second conductive semiconductor layer 250 or the light transmitting electrode layer (not shown), which in turn inhibits re-absorption or scattering of the light, thereby contributing to improvement in light extraction efficiency of the light emitting device 200.

The light emitting structure 260 may have passivation formed on a lateral side or a top region thereof, and the passivation may be formed of an insulating material.

FIGS. 3 to 7 illustrate a process of fabricating the light emitting device shown in FIG. 1A.

According to one embodiment described hereinafter, a first conductive semiconductor layer 320 realized with an n-type semiconductor layer is positioned under a second conductive semiconductor layer 370, without being particularly limited thereto. It is of course appreciated that the first conductive semiconductor layer 320 may be realized with a p-type semiconductor layer while a first n-type semiconductor layer 321 and a second n-type semiconductor layer 322 may be replaced by a first p-type semiconductor layer and a second p-type semiconductor layer, respectively.

Figure 3:
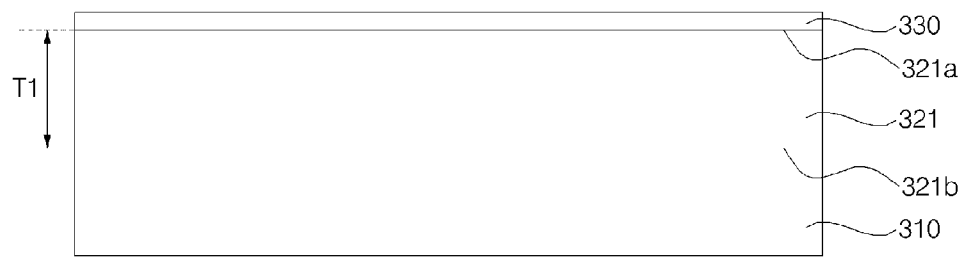
FIGS. 3 to 7 illustrate a process of fabricating the light emitting device shown in FIG. 1A.

First, referring to FIG. 3, a first n-type semiconductor layer 321 and a reflective layer 330 may be sequentially provided on a first substrate 310.

The first substrate 310 may be selected from a sapphire ($Al_2O_3$), GaN, SiC, ZnO, Si, GaP, InP or GaAs substrate and, although not illustrated in the drawings, a buffer layer (not shown) may be provided between the substrate 310 and the first n-type semiconductor layer 321.

A buffer layer (not shown) may be formed of a combination of Group III and V elements or using at least one selected from GaN, InN, AlN, AlInN, InGaN, AlGaN and InAlGaN, and/or may be doped with a dopant.

The first substrate 310 or buffer layer (not shown) may be provided with an undoped semiconductor layer (not shown), may include either one or both of the buffer layer (not shown) and undoped semiconductor layer (not shown) formed thereon or, otherwise, neither of the foregoing layers, without being particularly limited thereto.

The first n-type semiconductor layer 321 may be doped with an n-type dopant and/or have any one of GaN compound semiconductors selected from a GaN layer, AlGaN layer or InGaN layer, or the like.

The first n-type semiconductor layer 321 may have a thickness $T_1$ of 5 μm or more. The first n-type semiconductor layer 321 predominantly comprises an N-phase at a region nearest the first substrate 310 while exhibiting increase in a Ga-phase toward the upper portion thereof.

Accordingly, a first surface 321a of the first n-type semiconductor layer 321 predominantly comprises a Ga-phase while an N-phase may be predominant on a second surface 321b thereof.

Meanwhile, a reflective layer 330 may be provided on the first surface 321a of the first n-type semiconductor layer 321. The reflective layer 330 may comprise any one selected from Ag, Ni, Al, Rh, Pd, Ir, Ru, Mg, Zn, Pt, Au or Hf, and may be formed of metal oxides. Metal oxides may maintain a stable state under a high temperature atmosphere, compared to non-oxidized metals.

That is, a non-oxidized metal may be re-evaporated at high temperature during lamination of a semiconductor layer after forming the reflective layer 330. Also, when increasing temperature, the non-oxidized metal may be oxidized, thus impairing uniformity of the reflective layer 330.

On the other hand, the reflective layer 330 made of metal oxide may be formed by depositing a metal to the first surface 321a of the first n-type semiconductor layer 321 and then heating the same under an oxygen atmosphere or, otherwise, directly depositing a metal oxide through sputtering or the like.

Figure 4:
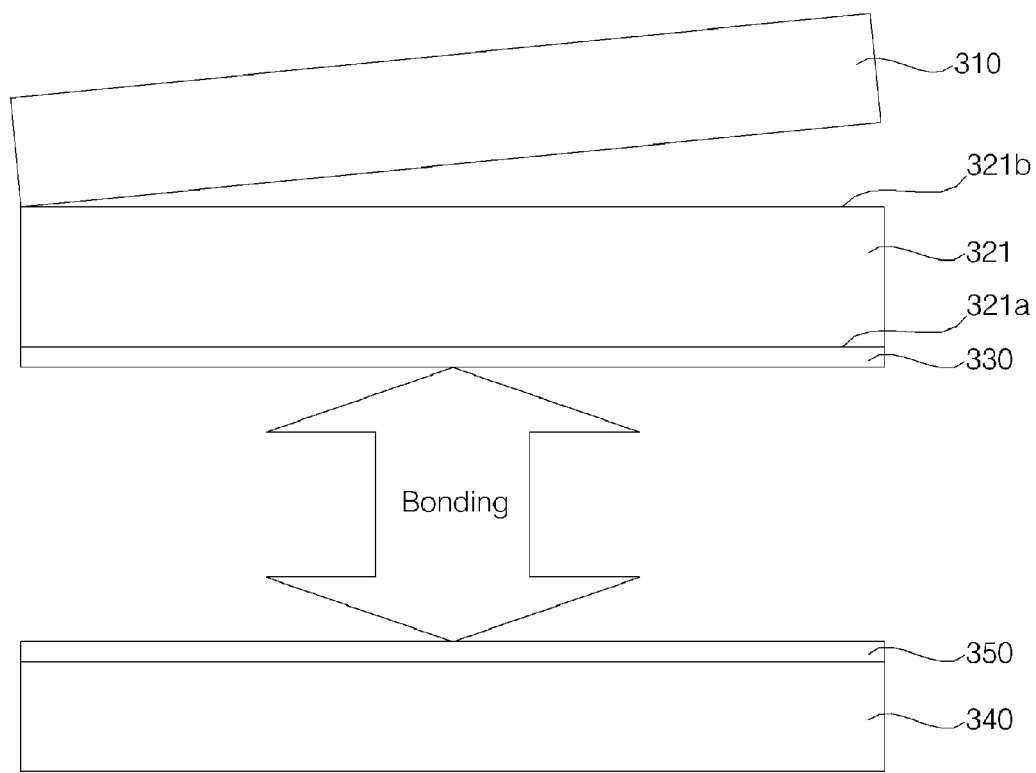

Then, as shown in FIG. 4, a second substrate 340 may be bonded to the reflective layer 330. The second substrate may be a support substrate, for example, a conductive support substrate. The second substrate 340 may be bonded to the reflective layer 330 through an adhesive layer 350.

The adhesive layer 350 may be formed using a polymer adhesive useable at a high temperature, which is not molten but can retain adhesiveness at high temperature.

After formation, the second substrate 340 is mounted as a base while removing the first substrate 310. Here, the first substrate 310 may be removed by physical and/or chemical methods and, as an example of physical methods, a laser lift-off process (LLO) may be applied.

Although not illustrated, after removing the first substrate 310, the buffer layer (not shown) placed above the first n-type semiconductor layer 321 may also be removed. In this case, the buffer layer (not shown) may be removed by dry or wet etching, or grinding.

The second surface 321b of the first n-type semiconductor layer 321 may be exposed by removing the first substrate 340.

Figure 5:
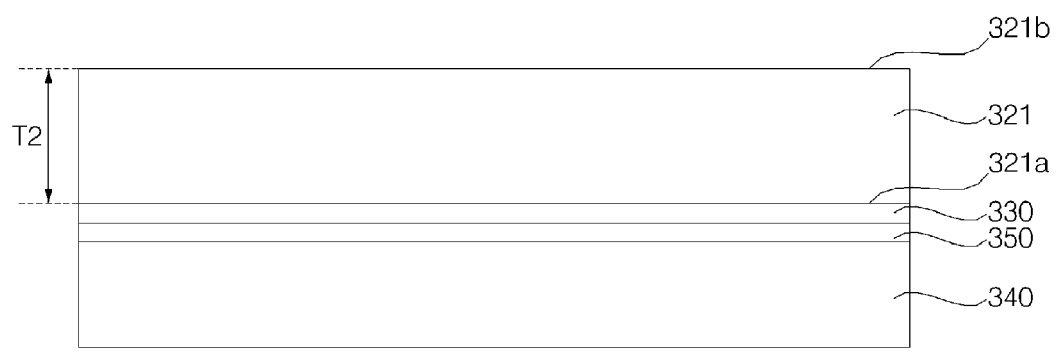
Figure 6:
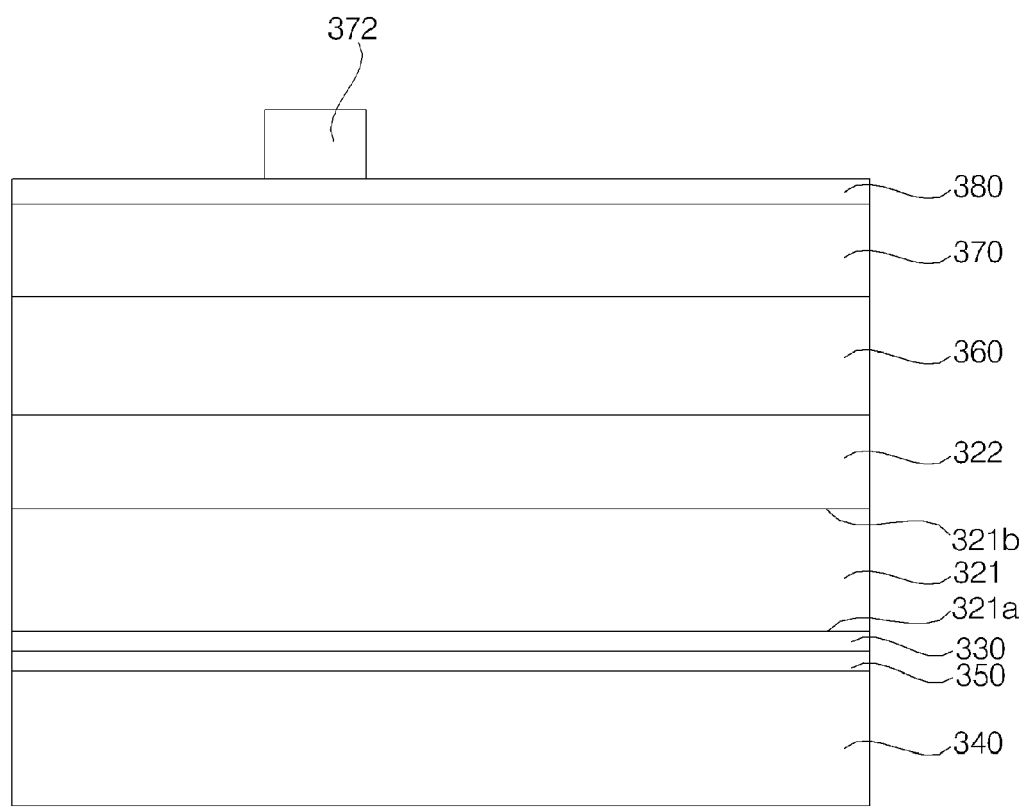

Referring to FIGS. 5 and 6, after the second surface 321b of the first n-type semiconductor layer 321 exposed by removing the first substrate 310 is etched, the second n-type semiconductor layer 322 may be formed on the etched second surface 321b.

The first n-type semiconductor layer 321 laminated on a heterogeneous substrate 310 made of, for example, sapphire generally has a large number of crystal defects due to a great difference in lattice constant between the semiconductor layer 321 and the sapphire substrate 310, and such crystal defects tend to increase in a direction of growth.

Accordingly, as shown in FIG. 5, by removing a region of the first n-type semiconductor layer 321 nearer to the substrate 310 through desired etching, the first n-type semiconductor layer 321 may expose a region with decreased crystal defects. Moreover, transfer of potential toward the second n-type semiconductor layer 322, which is re-grown on the first n-type semiconductor layer 321 having decreased crystal defects, may be effectively prevented.

Furthermore, since a region of the first n-type semiconductor layer 321 is removed by etching, the second surface 321b of the first n-type semiconductor layer 321 is exposed and may be formed in an N-phase. The second n-type semiconductor layer 322 is re-grown on the N-phase of the first n-type semiconductor layer 321, thus improving crystal quality.

Here, a thickness $T_2$ of the etched first n-type semiconductor layer 321 may range from 2 to 3 μm in order to endure fracture or the like, when the second n-type semiconductor 322 is subjected to deposition.

Again referring to FIG. 6, the second n-type semiconductor layer 322 may be formed on the second surface 321b of the first n-type semiconductor layer 321.

The second n-type semiconductor layer 322 may have the same constitutional composition as the first n-type semiconductor layer 321.

Following this, an active layer 360, second conductive semiconductor layer 370 and light transmitting electrode layer 380 may be sequentially arranged on the second n-type semiconductor layer 322. The active layer 360, second conductive semiconductor layer 370 and light transmitting electrode layer 380 are substantially the same as illustrated in FIG. 1A and, therefore, a detailed description thereof will be omitted.

Figure 7:
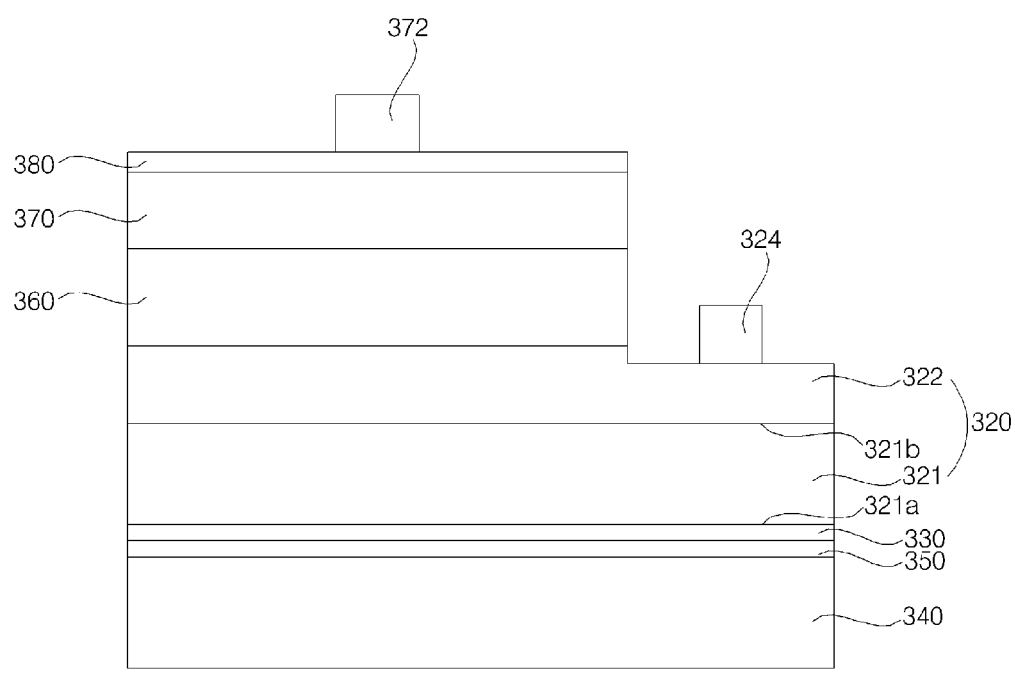

The light transmitting electrode layer 380 may be provided with a second electrode 372 formed of nickel (Ni) or the like and, as shown in FIG. 7, a part of the first conductive semiconductor layer 320 may be exposed by partially etching the second conductive semiconductor layer 370 and active layer 360 and the first electrode 324 may be formed on the exposed region of the first conductive semiconductor layer 320.

Accordingly, the light emitting device 300 may have decreased crystal defects, resulting in enhanced luminous efficacy of the light emitting device 300.

For convenience of explanation, even though the first n-type semiconductor layer 321 and second n-type semiconductor layer 322 have been respectively described, the second n-type semiconductor layer 322 may have the same constitutional composition as the first n-type semiconductor layer 321. Therefore, it is to be understood that the first conductive semiconductor layer 320 may further include the same one, that is, the first conductive semiconductor layer 320 re-grown and laminated thereon.

Figure 8:
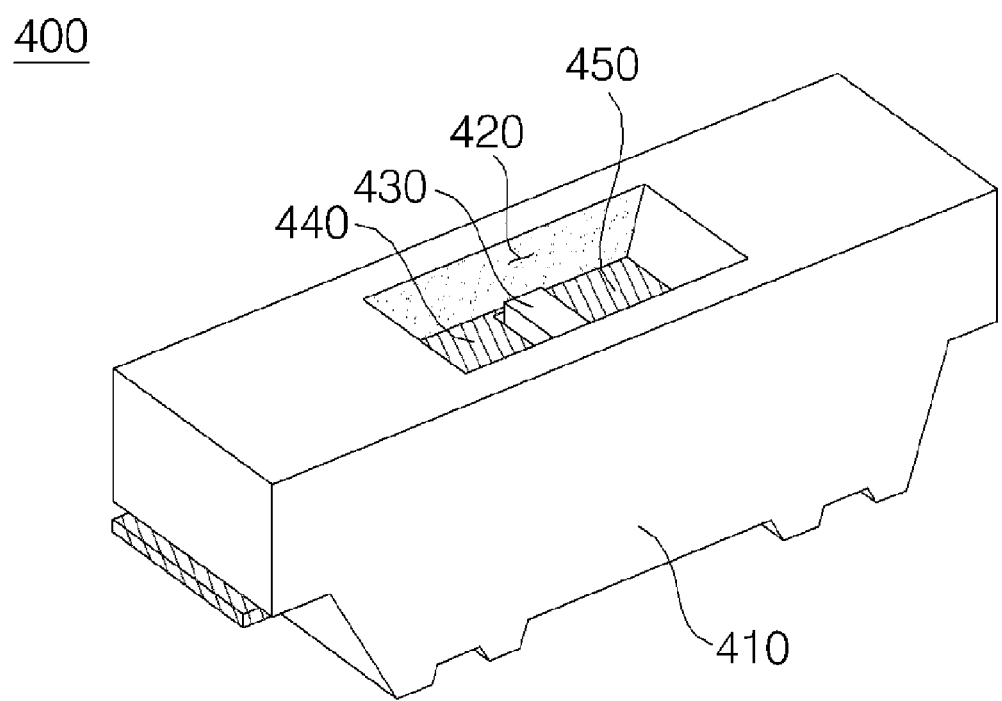
FIG. 8 is a perspective view illustrating a light-emitting device package including a light emitting device according to one embodiment.
Figure 9:
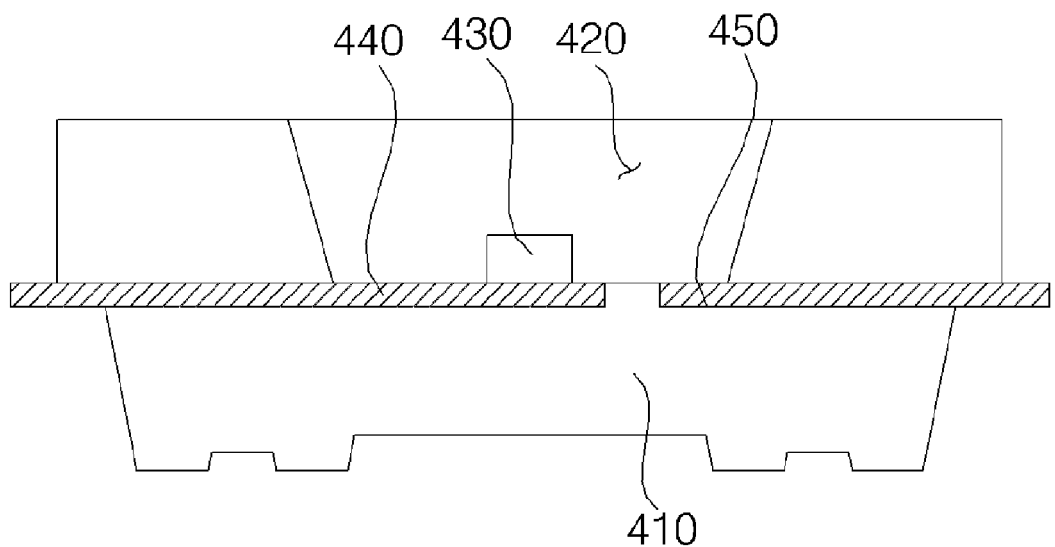
FIGS. 9 and 10 are cross-sectional views illustrating the light-emitting device package shown in FIG. 8.
Figure 10:
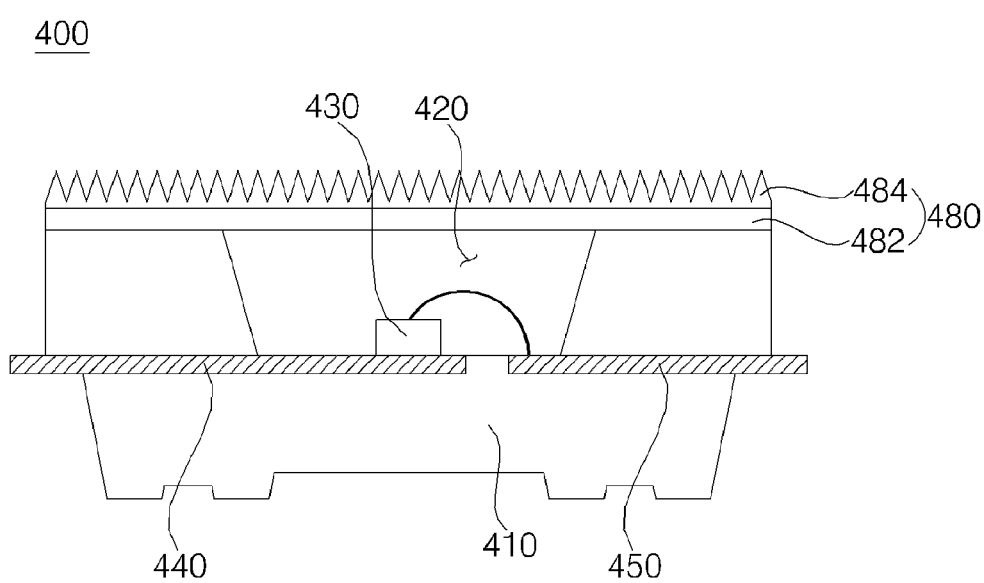

FIGS. 8 to 10 are a perspective view and two cross-sectional views illustrating a light-emitting device package according to one embodiment.

Referring to FIGS. 8 to 10, a light-emitting device package 400 may include a body 410 having a cavity 420, first and second lead frames 440 and 450 mounted on the body 410, a light emitting device 430 electrically connected to the first and second lead frames 440 and 450, and a sealant (not shown) filling the cavity 420 to cover the light emitting device 430.

The body 410 may be formed using at least one selected from polyphthalamide (PPA) as a resin material, silicon (Si), aluminum nitride (AlN), liquid crystal polymer (photo sensitive glass, PSG), polyamide 9T (PA9T), syndiotactic polystyrene (SPS), metal materials, sapphire ($Al_2O_3$), beryllium oxide (BeO), printed circuit boards (PCB), and so forth. The body 410 may be formed by a process such as injection molding, etching, etc., without being particularly limited thereto.

An inner surface of the body 410 may be provided with an inclined surface. A reflective angle of light emitted from the light emitting device 430 may be varied, depending on the angle of the inclined surface. Accordingly, the orientation angle of light emitted to the outside can be controlled.

As the orientation angle of the light is decreased, convergence of the light emitted from the light emitting device 430 to the outside is increased. On the contrary, if the orientation angle of the light is increased, convergence of the light emitted from the light emitting device 430 to the outside is reduced.

As seen from the top, the cavity 420 provided in the body 410 may have various shapes including, but not being limited to, a circular shape, a rectangular shape, a polygonal shape, an oval shape and a shape with curved corners.

The light emitting device 430 is mounted on the first lead frame 440 and may include, but not being limited to, light emitting devices to emit red, green, blue or white light, and UV light emitting devices to emit ultraviolet light. Further, at least one light emitting device 430 may be mounted on the lead frame.

Further, the light emitting device 430 may be applied to a horizontal light-emitting device, in which all electrical terminals thereof are formed on the upper surface, a vertical light-emitting device, in which electrical terminals thereof are formed on the upper or lower surface, and a flip chip light-emitting device.

Meanwhile, the light emitting device 430 according to one embodiment includes a light emitting structure (not shown) provided with a light extraction structure (not shown), and the light emitting structure (not shown) includes an undoped layer (not shown) serving as an etching stop layer to prevent damage of an active layer (not shown) in the light emitting structure (not shown), which in turn improves brightness and reliability of each of the light emitting device 430 and light-emitting device package 400.

The sealant (not shown) may fill the cavity 420 to cover the light emitting device 430.

The sealant (not shown) may be composed of silicon, epoxy or other resin materials and may be formed by filling the cavity 420 with a sealant, followed by UV or heat curing.

In addition, the sealant (not shown) may include a phosphor, and the phosphor is selected, considering the wavelength of light emitted from the light emitting device 430 to allow the light-emitting device package 400 to render white light.

The phosphor may be any one selected from a blue light emitting phosphor, blue-green light emitting phosphor, green light emitting phosphor, yellow-green light emitting phosphor, yellow light emitting phosphor, yellow-red light emitting phosphor, orange light emitting phosphor and red light emitting phosphor, depending upon the wavelength of light emitted by the light emitting device 430.

That is, the phosphor is excited by first light emitted from the light emitting device 430 to create second light. For instance, in the case where the light emitting device 430 is a blue light emitting diode (LED) and the phosphor 240 is a yellow phosphor, the yellow phosphor is excited by blue light to emit yellow light, and blue light emitted from the blue LED and yellow light excited from the blue light are combined, the light-emitting device package 400 may emit white light.

Similarly, if the light emitting device 430 is a green LED, a magenta phosphor as well as blue and red phosphors may be employed together. Alternatively, when the light emitting device 430 is a red LED, a cyan phosphor as well as blue and green phosphors may be employed together.

Such phosphor may be any one commonly known in the art, such as YAG, TAG, sulfide, silicate, aluminate, nitride, carbide, nitride-silicate, borate, fluoride or phosphate based material, etc.

The first and second lead frames 440 and 450 may include a metal material selected from, for example, titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), iron (Fe), and alloys thereof. In addition, the first and second lead frames 440 and 450 may have a monolayer or multilayer structure, without being limited thereto.

The first and second lead frames 440 and 450 may be electrically isolated from each other. The light emitting device 430 may be mounted on the first and second lead frames 440 and 450, and the first and second lead frames 440 and 450 may directly contact the light emitting device 430 or, otherwise, be electrically connected through a conductive material such as a soldering member (not shown). Alternatively, the light emitting device 430 may be electrically connected to the first and second lead frames 440 and 450 through wire-bonding, without being particularly limited thereto. Accordingly, if the first and second lead frames 440 and 450 are connected to a power supply, electric current may be applied to the light emitting device 430. Further, multiple lead frames (not shown) may be built in the body 410 and respective ones may be electrically connected to the light emitting device 430, without being particularly limited thereto.

Referring to FIG. 10, the light-emitting device package 400 according to one embodiment may include an optical sheet 480 and the optical sheet 480 may include a base part 482 and a prism pattern 484.

The base 482 is a supporter to form the prism pattern 484, which is composed of a transparent material exhibiting superior thermal stability. For example, such a transparent material may be selected from the group consisting of polyethylene terephthalate, polycarbonate, polypropylene, polyethylene, polystyrene and polyepoxy, without being particularly limited thereto.

In addition, the base 482 may include a phosphor (not shown). For example, the base 482 may be formed by homogenously dispersing a phosphor (not shown) in the material constituting the base 482, followed by curing. When the base 482 is formed according to this method, the phosphor (not shown) can be homogeneously dispersed throughout the base 482.

Meanwhile, a prism pattern 484 to refract and concentrate light may be arranged on the base 482. A material for the prism pattern 484 may be an acrylic resin, without being particularly limited thereto.

The prism pattern 484 includes a plurality of linear prisms arranged in one direction on one surface of the base 482 such that the linear prisms are parallel to one another and the cross-section of the linear prisms taken along an axial direction may take the shape of a triangle.

The prism pattern 484 can concentrate light. For this reason, when the optical sheet 480 is adhered to the light-emitting device package 400 of FIG. 8, straightness of light can be improved and brightness of the light-emitting device package 400 can be thus enhanced.

Meanwhile, the prism pattern 484 may include a phosphor (not shown).

The phosphor (not shown) may be uniformly present in the prism pattern 484 by mixing the phosphor with an acrylic resin which forms the prism pattern 484 in a dispersed state to produce a paste or slurry and then forming the prism pattern 484.

In the case where the phosphor (not shown) is present in the prism pattern 484, light uniformity and distribution level of the light-emitting device package 400 are improved and the orientation angle of the light-emitting device package 400 can thus be improved because of dispersion of light by the phosphor (not shown) as well as concentration of light by the prism pattern 484.

The light-emitting device package 400 according to one embodiment is arrayed in plural on the substrate and optical members such as the light guide plate, prism sheet and diffusion sheet may be arranged on a light passage of the light-emitting device package 400. The light-emitting device package, the substrate and the optical members may serve as a light unit. In another embodiment, a display device, an indicating device and a lighting device including the light-emitting device or light-emitting device packages disclosed in the afore-mentioned embodiments may be realized. For example, the lighting device may include a lamp, a streetlamp, or the like.

Figure 11:
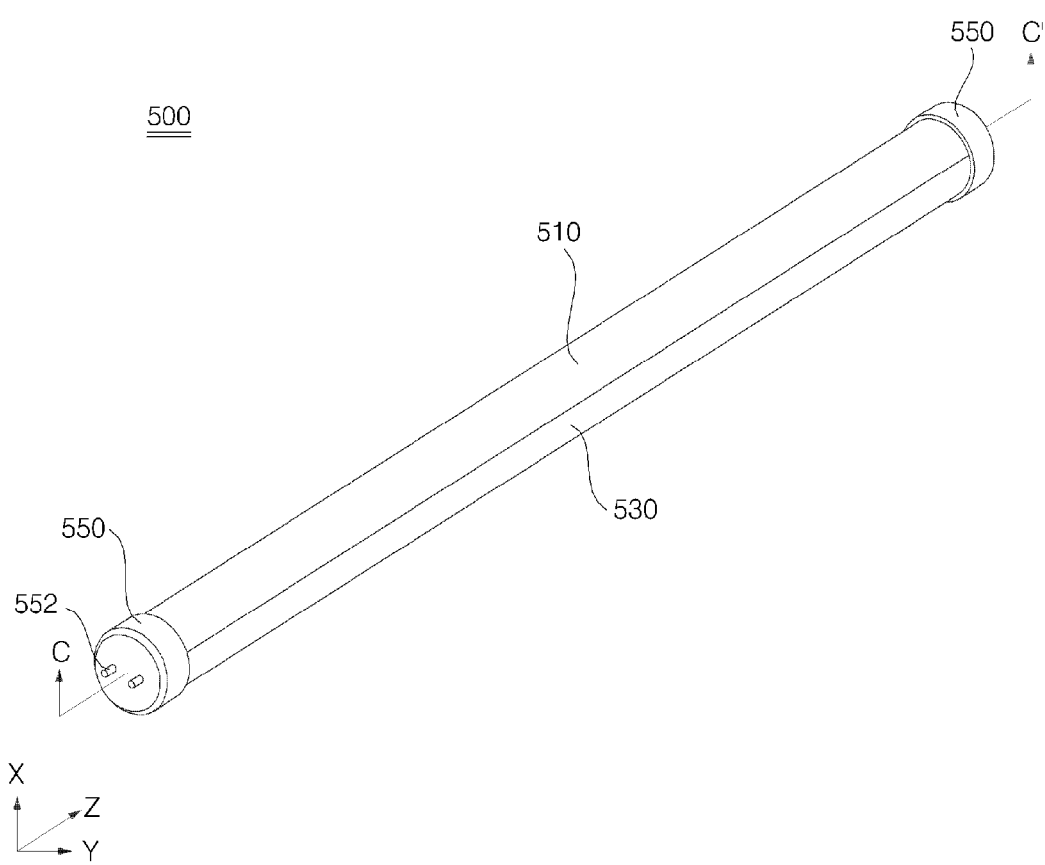
FIG. 11 is a perspective view illustrating a lighting instrument including a light emitting device according to one embodiment.
Figure 12:
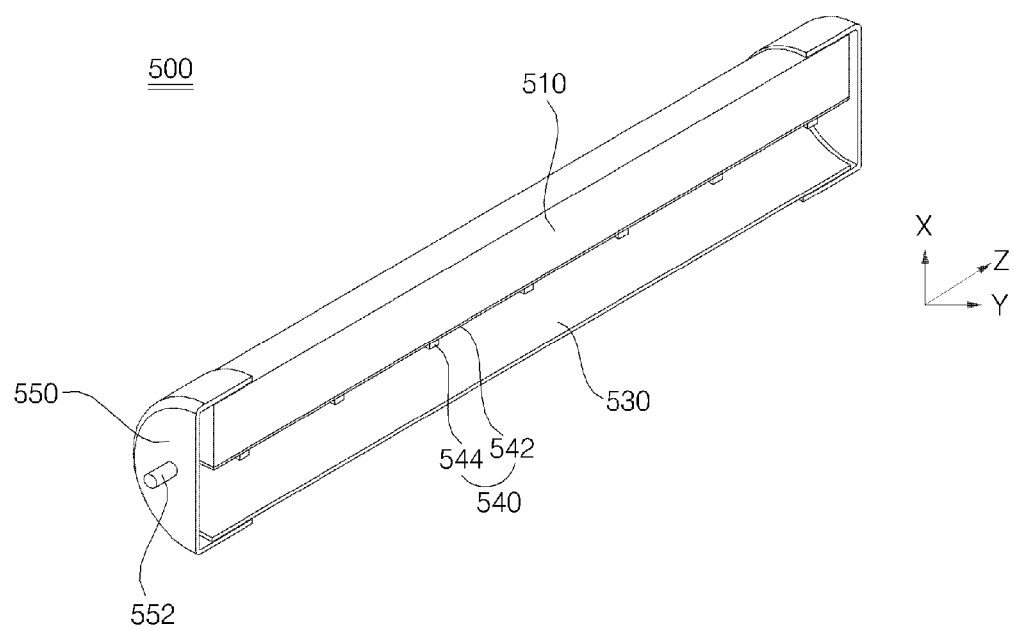
FIG. 12 is a cross-sectional view taken along the line A-A' of FIG. 11.

FIG. 11 is a perspective view illustrating a lighting instrument having a light emitting device according to one embodiment, and FIG. 12 is a cross-sectional view showing a cross section C-C' of the lighting instrument shown in FIG. 11.

Referring to FIGS. 11 and 12, the lighting instrument 500 may include a body 510, a cover 530 coupled with the body 510, and end caps 550 provided to both ends of the body 510.

The body 510 may be connected with a light-emitting device module 540 at the bottom side thereof and, in order to discharge heat generated from a light-emitting device package 544 to the outside through the top of the body 510, the body 510 may be made of metal materials having excellent thermal conductivity and heat dissipation effects.

The light-emitting device package 544 may be mounted on a PCB 542 with multiple colors and in multiple rows to form an array, and may be spaced from one another by a predetermined interval or, if necessary, by different distances, to control brightness. Such PCB 542 may be a metal core PCB (MPPCB) or PCB made of FR4.

The cover 530 may take the shape of a circle to surround the bottom of the body 510, without being limited thereto.

The cover 530 protects the light-emitting device module 540 from foreign substances. In addition, the cover 530 prevents glare occurred by the light-emitting device package 544 and includes diffusion particles to uniformly discharge light to the outside. In addition, a prism pattern or the like may be formed on at least one of the inner and outer surfaces of the cover 530. Alternatively, a phosphor may be applied onto at least one of the inner and outer surfaces of the cover 530.

Meanwhile, the cover 530 should exhibit superior light transmittance to discharge light emitted by the light-emitting device package 544 through the cover 530 to the outside, and the cover 530 should exhibit sufficient heat resistance to endure heat generated from the light-emitting device package 544. Preferably, the cover 530 is composed of a material including polyethylene terephthalate (PET), polycarbonate (PC) or polymethyl methacrylate (PMMA) and the like.

The end cap 550 is arranged on both ends of the body 510 and may be used to seal a power device (not shown). In addition, the end cap 550 is provided with a power pin 552, allowing the lighting instrument 500 to be applied to a terminal from which a conventional fluorescent light has been removed, without using any additional device.

Figure 13:
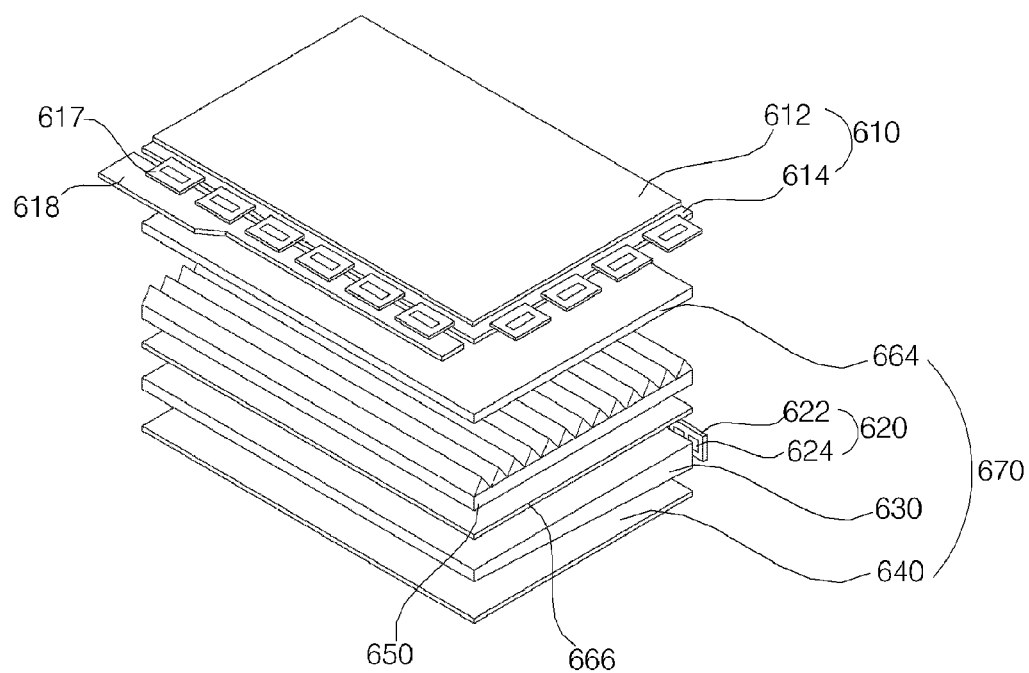
FIG. 13 is an exploded perspective view illustrating a liquid crystal display including a light emitting device according to one embodiment.

FIG. 13 is an exploded perspective view illustrating a backlight unit having a light emitting device according to one embodiment.

FIG. 13 illustrates an edge-light type liquid crystal display device 600 which includes a liquid crystal display panel 610 and a backlight unit 670 to supply light to the liquid crystal display panel 610.

The liquid crystal display panel 610 displays an image using light supplied from the backlight unit 670. The liquid crystal display panel 610 includes a color filter substrate 612 and a thin film transistor substrate 614 which face each other through liquid crystal interposed therebetween.

The color filter substrate 612 can render color images to be displayed through the liquid crystal display panel 610.

The thin film transistor substrate 614 is electrically connected to a printed circuit board 618 on which a plurality of circuit components is mounted through a driving film 617. The thin film transistor substrate 614 responds to drive signals supplied from the printed circuit board 618 and may apply drive voltage from the printed circuit board 618 to liquid crystals.

The thin film transistor substrate 614 includes a thin film transistor and a pixel electrode formed as a thin film on other substrates composed of a transparent material such as glass or plastic.

The backlight unit 670 includes; a light-emitting device module 620 to emit light, a light guide plate 630 to convert light emitted by the light-emitting device module 620 into surface light and supply the light to the liquid crystal display panel 610, a plurality of films 650, 666 and 664 to uniformize brightness distribution of light emitted by the light guide plate 630 and improve vertical incidence, and a reflective sheet 640 to reflect light emitted to the back of the light guide plate 630 to the light guide plate 630.

The light-emitting device module 620 includes a plurality of light-emitting device packages 624 and a PCB 622 on which the light-emitting device packages 624 are mounted to form an array.

Meanwhile, a backlight unit 670 includes a diffusion film 666 to diffuse light projected from the light guide plate 630 toward the liquid crystal display panel 610, a prism film 650 to concentrate the diffused light and thus improve vertical incidence, and a protective film 664 to protect the prism film 650.

Figure 14:
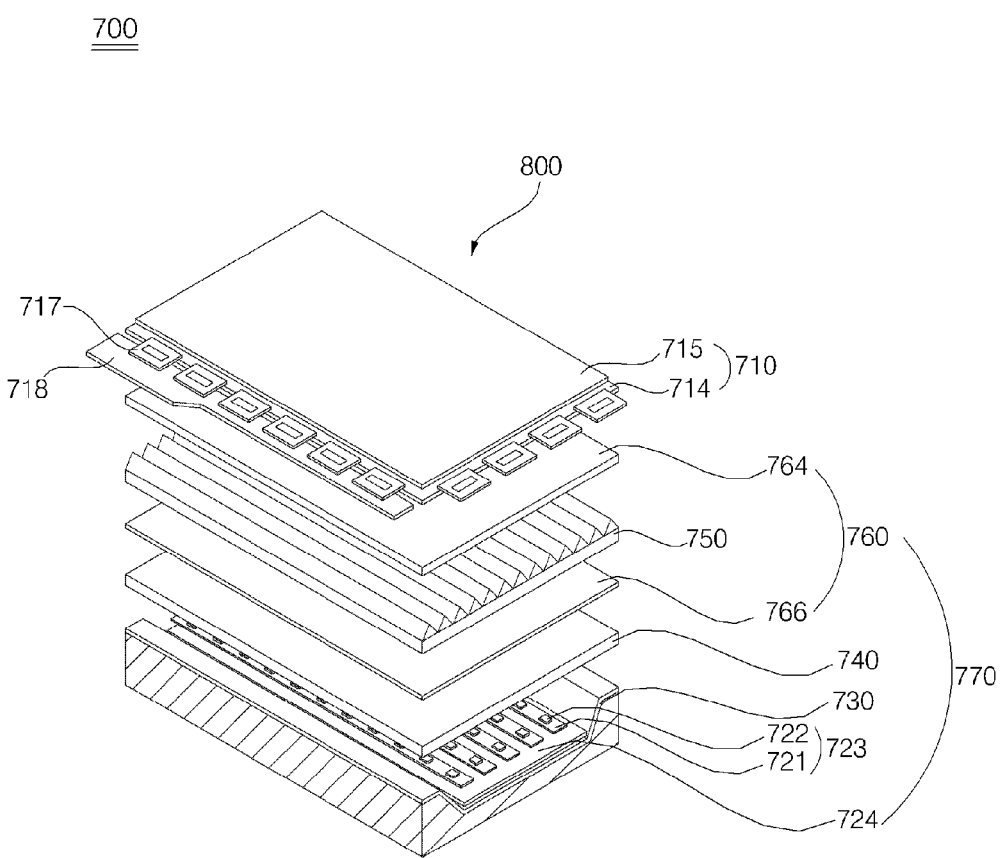
FIG. 14 is an exploded perspective view illustrating a liquid crystal display including a light emitting device according to one embodiment.

FIG. 14 is an exploded perspective view illustrating a liquid crystal display including the light emitting device according to one embodiment. However, the contents illustrated and described in FIG. 13 are not mentioned in detail.

FIG. 14 illustrates a direct-type liquid crystal display device 700 which includes a liquid crystal display panel 710 and a backlight unit 770 to supply light to the liquid crystal display panel 710.

The liquid crystal display panel 710 is substantially the same as described in FIG. 13 and a detailed explanation thereof is omitted.

The backlight unit 770 includes a plurality of light-emitting device modules 723, a reflective sheet 724, a lower chassis 730 in which the light-emitting device modules 723 and the reflective sheet 724 are accepted, a diffusion plate 740 positioned above the light-emitting device modules 723, and a plurality of optical films 760.

Each light-emitting device module 723 includes a plurality of light-emitting device packages 722 and a PCB 721 on which the light-emitting device packages 722 are mounted to form an array.

The reflective sheet 724 reflects light emitted from the light-emitting device package 722 toward the liquid crystal display panel 710, so as to improve luminous efficacy.

The reflective sheet 724 reflects light emitted from the light-emitting device package 722 toward the liquid crystal display panel 710, so as to improve luminous efficacy.

Meanwhile, light emitted from the light-emitting device module 723 is projected onto the diffusion plate 740 and an optical film 760 is arranged on top of the diffusion plate 740. The optical film 760 includes a diffusion film 766, a prism film 750 and a protective film 764.

The light emitting device according to the embodiments is not limited to configurations and processes illustrated in the fore-mentioned embodiments. Further, those skilled in the art will appreciate that a variety of combinations and modifications of partially or entirely selected parts of respective embodiments are possible.

Although the embodiments have been disclosed for illustrative purposes, those skilled in the art will appreciate that various modifications, additions and substitutions are possible, without departing from the scope and spirit of the embodiments as disclosed in the accompanying claims. For example, the respective elements described in detail in the embodiments may be modified. Further, it will be understood that differences relating to these modifications, additions and substitutions are covered by the scope of the invention defined in the accompanying claims.

What is claimed is:

1. A light emitting device including a light emitting structure, the light emitting structure comprising;
    a first conductive semiconductor layer, a second conductive semiconductor layer and an active layer between the first and second conductive semiconductor layers, and an intermediate layer interposed between the first conductive semiconductor layer and the second conductive semiconductor layer;
    wherein the first conductive semiconductor layer is an n-type semiconductor layer including GaN and doped with an n-type dopant;
    wherein the first conductive semiconductor layer includes a first n-type semiconductor layer and a second n-type semiconductor layer between the first n-type semiconductor layer and the active layer;
    wherein one surface of the first n-type semiconductor layer contacts the second n-type semiconductor layer;
    wherein the surface of the first n-type semiconductor layer coming in contact with the second n-type semiconductor layer is formed in an N-phase; and
    wherein the intermediate layer is an electron blocking layer.

2. The light emitting device according to claim 1, wherein a thickness of the first n-type semiconductor layer ranges from 2 to 3 μm.

3. The light emitting device according to claim 1, wherein the n-type dopant includes any one of Si, Ge and Sn.

4. The light emitting device according to claim 1, wherein the first n-type semiconductor layer has a first refractive index and the second n-type semiconductor layer has a second refractive index, and wherein the first refractive index is equal to or less than the second refractive index.

5. The light emitting device according to claim 1, further comprising:
   a second electrode provided on the second conductive semiconductor layer;
   a substrate provided under the first conductive semiconductor layer; and
   a reflective layer between the substrate and the first conductive semiconductor layer, wherein the active layer and second conductive semiconductor are partially removed to expose a part of the top side of the first conductive semiconductor layer and a first electrode is provided on the exposed top side of the first conductive semiconductor layer.

6. The light emitting device according to claim 5, wherein the reflective layer includes any one selected from Ag, Ni, Al, Rh, Pd, Ir, Ru, Mg, Zn, Pt, Au and Af.

7. The light emitting device according to claim 5, further comprising an adhesive layer between the substrate and the reflective layer.

8. The light emitting device according to claim 7, wherein the adhesive layer comprises a polymer resin.

9. The light emitting device according to claim 5, further comprising a light transmitting electrode layer provided on the second conductive semiconductor layer.

10. The light emitting device according to claim 9, wherein the light transmitting electrode layer comprises at least one of ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO.

11. The light emitting device according to claim 9, wherein at least one region of the light transmitting electrode layer is removed and the first electrode contacts the second conductive semiconductor layer through the removed region.

12. The light emitting device according to claim 5, wherein the substrate include at least one of sapphire and silicon.

13. The light emitting device according to claim 1, further comprising:
   a substrate provided under the second semiconductor layer;
   a first electrode between the substrate and the second conductive semiconductor layer; and
   a second electrode provided on the first conductive semiconductor layer.

14. The light-emitting device according to claim 13, further comprising:
   a light extraction structure on the light-emitting structure.

15. The light-emitting device according to claim 14, wherein the light extraction structure comprises a roughness having a predetermined roughness level.

16. The light emitting device according to claim 13, wherein the first electrode comprises at least one selected from an ohmic layer, a reflective layer or a bonding layer.

17. The light-emitting device according to claim 1, the intermediate layer has a greater band gap than the active layer.

18. A light-emitting device package comprising:
   a body;
   a first lead frame and a second lead frame on the package body; and
   a light-emitting device mounted on the body and electrically connected to the first and second lead frames,
   wherein the light-emitting device comprises:
      a light emitting structure, the light emitting structure comprising;
      a first conductive semiconductor layer, a second conductive semiconductor layer and an active layer between the first and second conductive semiconductor layers, and an intermediate layer interposed between the first conductive semiconductor layer and the second conductive semiconductor layer,
      wherein the first conductive semiconductor layer is an n-type semiconductor layer including GaN and doped with an n-type dopant;
      wherein the first conductive semiconductor layer includes a first n-type semiconductor layer and a second n-type semiconductor layer between the first n-type semiconductor layer and the active layer;
      wherein one surface of the first n-type semiconductor layer contacts the second n-type semiconductor layer;
      wherein the surface of the first n-type semiconductor layer coming in contact with the second n-type semiconductor layer is formed in an N-phase; and
      wherein the intermediate layer is an electron blocking layer.

19. A lighting system including a light emitting device as set forth in claim 1.

* * * * *